(12) United States Patent
West et al.

(10) Patent No.: US 7,151,881 B2
(45) Date of Patent: Dec. 19, 2006

(54) IMPURITY-BASED WAVEGUIDE DETECTORS

(75) Inventors: Lawrence C. West, San Jose, CA (US); Thomas P. Pearsall, Paris (FR); Francisco A. Leon, Palo Alto, CA (US); Stephen Moffatt, Jersey (GB)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/856,127

(22) Filed: May 28, 2004

(65) Prior Publication Data

US 2005/0053347 A1 Mar. 10, 2005

Related U.S. Application Data

(60) Provisional application No. 60/474,155, filed on May 29, 2003.

(51) Int. Cl.
*G02B 6/10* (2006.01)

(52) U.S. Cl. .......................... 385/129; 385/40; 385/14; 372/64

(58) Field of Classification Search .................. 385/14, 385/129, 40; 372/64
See application file for complete search history.

(56) References Cited

U.S. PATENT DOCUMENTS

| | | | |
|---|---|---|---|
| 4,486,765 A | 12/1984 | Capasso | |
| 4,835,575 A | 5/1989 | Plihal | |
| 5,122,852 A * | 6/1992 | Chang et al. ................ | 257/184 |
| 5,481,515 A | 1/1996 | Kando et al. ............. | 369/44.12 |
| 5,793,913 A | 8/1998 | Kovacic ....................... | 385/49 |
| 5,818,096 A | 10/1998 | Ishibashi et al. | |
| 5,942,789 A | 8/1999 | Morikawa et al. | |
| 6,075,253 A | 6/2000 | Sugiyama et al. | |
| 6,426,522 B1 | 7/2002 | Kean et al. .................. | 257/191 |
| 6,690,078 B1 | 2/2004 | Irissou et al. | |
| 6,753,214 B1 * | 6/2004 | Brinkmann et al. ........ | 438/184 |
| 6,770,134 B1 | 8/2004 | Maydan et al. | |
| 2002/0174827 A1 | 11/2002 | Samoilov et al. | |
| 2004/0012037 A1 | 1/2004 | Venkatesan et al. | |
| 2004/0012041 A1 | 1/2004 | West et al. | |
| 2004/0013338 A1 | 1/2004 | Bjorkman et al. | |
| 2004/0037512 A1 * | 2/2004 | Cho et al. ...................... | 385/88 |
| 2004/0155751 A1 * | 8/2004 | Benzel et al. .................. | 338/35 |
| 2005/0053347 A1 | 3/2005 | West et al. | |
| 2005/0214964 A1 | 9/2005 | West et al. | |
| 2006/0039666 A1 * | 2/2006 | Knights et al. ............. | 385/129 |

OTHER PUBLICATIONS

Tsutomu et al. (A selective epitaxial SiGe/Si planar photodetector for Si-based OEIC's, IEEE transactions on electron devices, vol. 44, No. 4, Apr. 1997).*

(Continued)

*Primary Examiner*—Minsun Oh Harvey
*Assistant Examiner*—Dung Nguyen
(74) *Attorney, Agent, or Firm*—Wilmer Cutler Pickering Hale & Dorr

(57) ABSTRACT

An optical circuit including a semiconductor substrate; an optical waveguide formed in or on the substrate; and an optical detector formed in or on the semiconductor substrate, wherein the optical detector is aligned with the optical waveguide so as to receive an optical signal from the optical waveguide during operation, and wherein the optical detector has: a first electrode; a second electrode; and an intermediate layer between the first and second electrodes, the intermediate layer being made of a semiconductor material characterized by a conduction band, a valence band, and deep level energy states introduced between the conduction and valence bands.

31 Claims, 6 Drawing Sheets

OTHER PUBLICATIONS

Pearsall et al., "Spectroscopy of Band-to-Band Optical Transitions in Si-Ge Alloys and Superlattices," Physical Review B, vol. 57, No. 15, 1998, pp. 9218-9140.

Tashiro et al., "A Selective Epitaxial SiGe/Si Planar Photodetector for Si-Based OEIC's," IEEE Transactions, vol. 44, No. 4, 1997, pp. 545-550.

Temkin et al., "Gex SI1-x Strained-Layer Superlattice Waveguide Photodetectors Operating Near 1.3um," Appl. Phys. Lett. vol. 48, No. 15, 1986, pp. 963-965.

Temkin et al., "Geo.6 Si0.4 Rib Waveguide Avalanche Photodetectors for 1.3 um Operation," Appl. Phys. Lett. 49, pp. 809-811.

Yang et al., A high speed, high sensitivity silicon lateral trench photodetector, IEEE Electron Device Letters vol. 23 No. 7, pp. 395-397, Jul. 2002.

* cited by examiner

IMPURITY-BASED WAVEGUIDE DETECTORS

This application claims the benefit of U.S. Provisional Application No. 60/474,155, filed May 29, 2003, which is incorporated herein by reference.

TECHNICAL FIELD

The invention generally relates to optical detectors and methods of fabricating such detectors.

BACKGROUND

To build an optical signal distribution network within a semiconductor substrate, one needs to make good optical waveguides to distribute the optical signals, and one needs to fabricate elements that convert the optical signals to electrical signals in order to interface with other circuitry. Extracting the optical signals can be accomplished in two ways. Either the optical signal itself is extracted out of the waveguide and delivered to other circuitry that can convert it to the required form. Or the optical signal is converted into electrical form in the waveguide and the electrical signal is delivered to the other circuitry. Extracting the optical signal as an optical signal involves the use of mirrors, gratings or couplers within the waveguides, or other elements that function like these devices. The scientific literature has an increasing number of examples of technologies that can be used to construct such devices. Extracting the optical signal as an electrical signal involves the use of detectors within the waveguide, i.e., circuit elements that convert the optical signal to an electrical form. The scientific literature also has an increasing number of examples of detector designs that can be used to accomplish this.

The challenge in finding the combination of elements that produces an acceptable optical distribution network becomes greater, however, when one limits the frame of reference to particular optical signal distribution network designs and takes into account the practical reality that any such designs should be relatively easy to fabricate and financially economical.

The combination of silicon and SiGe alloys (e.g. $Si_xGe_{1-x}$) has attracted attention as useful combination of materials from which one might be able to easily and economically fabricate optical signal distribution networks. With SiGe alloys it is possible to fabricate waveguides in the silicon substrates. The index of refraction of a SiGe alloy is slightly higher than that of silicon. For example, a SiGe alloy with 5% Ge (i.e., $Si_{0.95}Ge_{0.05}$) has an index of refraction of about 3.52 while crystalline silicon has an index of refraction that is less than that, e.g. about 3.50. So, if a SiGe alloy core is formed in a silicon substrate, the difference in the indices of refraction is sufficient to enable the SiGe alloy core to contain an optical signal through internal reflections. Moreover, this particular combination of materials lends itself to the use of conventional silicon based semiconductor fabrication technologies to fabricate the optical circuitry.

Of course, for such a system to work as an optical signal distribution network, the optical signal must have a wavelength to which both the Si and the SiGe alloy are transparent. Since the bandgap energy of these materials is approximately 1.1 eV, they appear transparent to optical wavelengths having a wavelength greater than 1150 nm. A further reduction in bandgap energy caused by use of a SiGe alloy rather than pure Silicon, and higher temperature operation as high as 125° C. may further require the wavelength be longer than 1200 nm or even 1250 nm for very low absorption loss (approximately 1 db/cm or less). But, the transparency of these materials to optical signals having those wavelengths brings with it another problem. These materials are generally not suitable for building detectors that can convert the optical signals to electrical form. To be a good detector, the materials must be able to absorb the light in a manner so as to create useful charge that can be detected electrically. That is, the optical signal must be capable of generating electron transitions from the valence band to the conduction band within the detector to produce an electrical output signal. But the wavelengths greater than 1150 nm are too long to produce useful absorption by electron transitions in silicon, or in $Si_{0.95}Ge_{0.05}$ alloys at room temperature. At a wavelength of 1300 nm, the corresponding photon energy is about 0.95 eV, well below the room temperature bandgap of silicon and $Si_{0.95}Ge_{0.05}$ and consequently well below the amount necessary to cause transitions from the valence band into the conductor band.

SUMMARY

In general, in one aspect, the invention features an optical circuit including: a semiconductor substrate; an optical waveguide formed in or on the substrate; and an optical detector formed in or on the semiconductor substrate, wherein the optical detector is aligned with the optical waveguide so as to receive an optical signal from the optical waveguide during operation. The optical detector has: a first electrode; a second electrode; and an intermediate layer between the first and second electrodes. The intermediate layer includes a semiconductor material characterized by a conduction band, a valence band that is at a lower energy level than the conduction band, and deep level energy states introduced between the conduction and valence bands.

Other embodiments include one or more of the following features. The optical detector is formed in the waveguide and the waveguide is formed in a trench in the substrate. The substrate is made of silicon. The optical waveguide includes a core made of a SiGe alloy. The first electrode is made of a first doped semiconductor material and the second electrode is made of a second doped semiconductor material and the first and second doped semiconductor materials are of the same conductivity type. The first semiconductor material is a first doped silicon and the second semiconductor material is a second doped silicon. The first and second doped silicons of opposite conductivity types or alternatively, they are of the same conductivity type. The first and second doped semiconductor materials are either both N-type or both P-type. The doping of the first and second semiconductor materials increases as a function of distance from the intermediate layer The semiconductor material is a SiGe alloy, e.g. $Si_{0.95}Ge_{0.05}$. The semiconductor material is doped with at least one of indium and thallium to produce the deep level energy states. The semiconductor material also includes a co-dopant that functions to either substantially fill or substantially deplete said deep level energy states or improve optical activation of the deep level energy states. The co-dopant is carbon or it is selected from the group consisting of arsenic, phosphorous, and carbon.

In general, in another aspect, the invention features an optical detector including: a first electrode; a second electrode; and an intermediate layer between the first and second electrodes, wherein the intermediate layer is made of a semiconductor material characterized by a conduction band, a valence band that is at a lower energy level than the conduction band, and deep level energy states introduced between the conduction and energy bands, and it also includes a co-dopant that functions to either substantially fill or substantially deplete said deep level energy states or improve optical activation of the deep level energy states.

In general, in yet another aspect, the invention features a method of fabricating an optical circuit. The method involves: fabricating a waveguide on or in a substrate; and over a selected portion of the waveguide, fabricating an optical detector, wherein fabricating the waveguide involves: depositing a first cladding material; depositing a core material on the first cladding material, wherein the core material is a semiconductor material characterized by a conduction band and a valence band that is at a lower energy level than the conduction band; and depositing a second cladding material on the core material. Fabricating the optical detector involves: producing a first conducting electrode from the first cladding material; producing an intermediate layer from the core material, wherein producing the intermediate layer involves introducing deep level energy states between the conduction and valence bands of the semiconductor material; and producing a second conducting electrode from the second cladding on the intermediate layer.

In other embodiments, producing the intermediate layer also involves introducing a co-dopant into the first-mentioned semiconductor material that functions to either substantially fill or substantially deplete said deep level energy states or improve optical activation of the deep level energy states.

In general, in still yet another aspect, the invention features a method of fabricating an optical detector. The method involves: producing a first conducting electrode; producing an intermediate layer on top of the first conducting electrode, wherein the intermediate layer is made of a semiconductor material characterized by a conduction band and a valence band that is at a lower energy level than the conduction band; and producing a second electrode on the intermediate layer. Producing the intermediate layer also involves introducing deep level energy states into the semiconductor material between the conduction and valence bands and introducing a co-dopant into the semiconductor material that functions to either substantially fill or substantially deplete said deep level energy states or improve optical activation of the deep level energy states.

One important advantage of at least some embodiments of the invention is that they are particularly thermally robust. That is the detectors are able to survive the subsequent thermal cycling of the wafers during later transistor fabrication. Thus, they can be used in optical ready substrates or semiconductor wafers which are expected to undergo further processing to fabricate microelectronics components.

Some of the embodiments of the invention are particularly well suited for use in the optical ready substrates described below. Other embodiments have more general applications in areas such as telecommunications.

Other features and advantages of the invention will be apparent from the following detailed description and from the claims.

DETAILED DESCRIPTION

An Impurity-Based Detector

One embodiment of the invention is an impurity-based detector that is made of silicon and a SiGe alloy and that satisfactorily detects optical signals with wavelengths that are longer than the wavelength corresponding to the absorption edge of silicon or SiGe alloy including optical signals with a wavelength longer than 1150 nm. The detectors are made within a waveguide typically having a SiGe alloy of about 5% Ge forming the waveguide core by doping that core with a material that generates deep energy levels within the bandgap energy region of the SiGe alloy. That is, the dopant is characterized by producing energy states that are sufficiently far from either conduction or valance band so that an optical signal with a wavelength greater than 1150 nm will cause transitions of electrons between this dopant-induced state and one of the bands, creating free charge for an electrical current, thereby detecting the optical signal.

Figure 1:
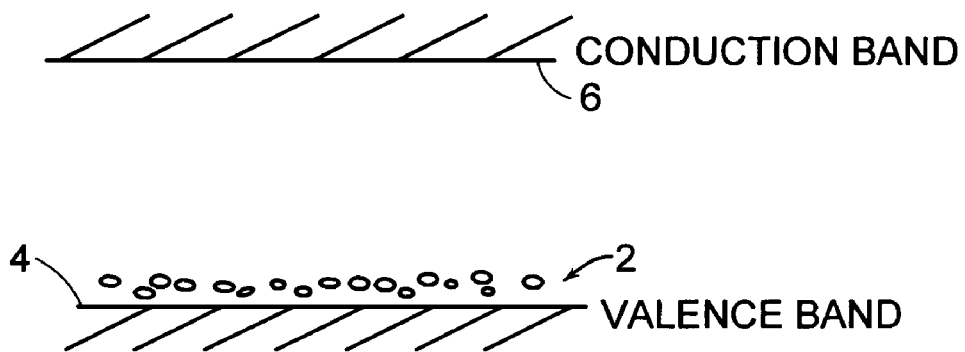
FIG. 1 shows the band structure of silicon doped with deep level acceptors.

Within the periodic table there are a number of elements that produce deep energy levels in semiconductors. Two elements, in particular, share a number of characteristics that are important for constructing detectors that can be incorporated into conventional fabrication processes that one might typically find in the silicon semiconductor fabrication industry. They are thallium and indium. Referring to FIG. 1, they produce deep acceptor states 2, which means their energy states are closer to the valance band 4 than the conduction band 6, but far enough above the valence band to allow wavelengths longer than 1200 nm to be productively absorbed. Indium produces acceptor states at about 160 meV above the valence band and thallium produces acceptor states that are about 260 meV above the valence band. Both of those elements also have diffusion rates that are slow enough that they will stay substantially in place under normal fabrication and operational temperatures that the detectors might experience if used in an optical ready substrate in which other microelectronic devices are later fabricated. That is, they will not diffuse out of the detector during subsequent thermal cycles to which the wafer will be exposed.

It should also be noted that the impurity states could through a more complex interaction with the band edge produce a broad or smooth distribution of deep energy levels when incorporated into Si or a SiGe alloy. Thus a broad impurity absorption spectrum can occur near the band edge, appearing as an extension or tailing of the band absorption. This broad spectrum is generally useful in aiding the tolerance of the detector to known temperature shifts in the band gap that would otherwise move the absorption energy off resonance from the light quantum energy and negatively affect absorption with temperature changes.

The transition that is of interest in the described embodiment of the SiGe alloy impurity-based detector could be from valance band to conduction band via energy state bands that extend or tail into the energy gap because of the impurity effects, or from more band-isolated deep acceptor states to the conduction band. It is these transitions that will produce the electrical detection signal. When a SiGe alloy is doped with either indium or thallium, many of the valence states are ionized to produce the holes that characterize p-type semiconductor materials. To increase the population of electrons in the deep acceptor states, i.e., to fill the available acceptor sites, the SiGe alloy is also doped with a donor material, e.g. As or P. The electrons from the donor dopant fill the acceptors sites and thereby increase the number of acceptor sites that are available to support a transition of an electron up into the conduction band. This filling of the acceptor sites could also occur from transfer of electrons from donors in an adjacent N-type region within a PN diode structure to be discussed later.

The use of such co-dopants also yields another benefit in photoconductive detector mode to be discussed later. Filling up the holes generated by the deep level acceptor dopant, decreases the number of free electrons and/or holes that facilitate conduction through the material and thereby increase its resistance. In photoconductive detectors, the impurity-based SiGe alloy is used as the material for the intrinsic or low charge region between the two of same type (N or P) electrodes. The lower the resistance of this region, the higher the dark current that is produced by the device in the absence of an optical signal. It is desirable to keep the dark current as low as possible. Introducing an opposite type co-dopant along with the deep level state helps accomplish this objective. If the co-dopant is increased beyond that needed to make the material intrinsic, or charge balanced, then the material can have the charge of the opposite sign in the other band. This leads to a photo-transistor effect that can provide more gain at the expense of bandwidth or speed. This device will be discussed in more detail later.

The increase in the population of both holes and electrons by using co-dopants also yields yet another benefit. It helps reduce the recombination time of free charges, which is the time needed for a detector to recover after sensing an optical signal, especially in photoconductive type detectors. Stated differently, it increases the recombination rate of electrons and holes, thereby increasing the speed of the device due to there being more electrons and holes together.

Both indium and thallium are characterized by a low solid solubility in Si or SiGe alloys. That means there is an upper limit to how much each of these materials can be added to the silicon lattice before the lattice will no longer accept more of it. The optimum doping levels appear to be in the range of about $10^{16}$ cm$^{-3}$ to $10^{18}$ cm$^{-3}$. In the case of thallium the highest doping levels are typically around $2 \times 10^{17}$ cm$^{-3}$. To increase this effective density and thereby increase the efficiency of the detectors that are fabricated from these materials one can add a co-dopant that increases the solid solubility of the material in the silicon lattice. In essence, the co-dopant keeps the deep level dopant in the lattice sites and discourages it from coming out of the lattice. In the case of indium, an example of a co-dopant that accomplishes that function is carbon. Other co-dopants that may help activation of indium and thallium include arsenic, phosphorous and other N-type donors in higher concentrations than needed just to fill acceptor sites.

In other words, there are at least four reasons for using one or more appropriate co-dopants along with the thallium or indium. First, they can be used to charge the acceptor impurity to fill the empty holes thereby increasing the number of electrons available to absorb the optical signal (i.e., increasing the sensitivity of the detector). Second, they can be used to produce a higher dark resistance by reducing the number of free charges. Third, they can be used to help reduce the recombination time (i.e., increases the recombination rate) of free charges. And fourth, they can be used to help increase the probability that the deep level acceptor element will occupy a lattice site instead of an interstitial site so as to be optically active. That is, they can produce better activation on the silicon lattice.

In addition, co-dopants can also serve still other useful functions in this context. For example, they can be used to reduce the diffusion coefficient of another co-dopant or they can be used to enhance the thermal stability of the deep level acceptor dopant making it less likely that it will become deactivated in the host lattice by thermal cycling or high temperature operation.

There are a number of co-dopants that serve one or more of the functions just described. For example, in the case of indium, carbon, a Group IV element, works to increase the solid solubility of the indium in the silicon lattice. A number of Group V elements, including the widely used elements of arsenic and phosphorous, serve multiple functions. For example, arsenic is a dopant that produces energy states that are about 14 meV from the conduction band. When used with indium or thallium, it significantly enhances the performance of the indium or the thallium by filling the holes with electrons thereby increasing the population of electrons that can undergo a transition into the conduction band. The arsenic also appears to help by enabling more indium or thallium to go into the lattice. And, in the case of indium, it appears to form more complex microstructures with the indium that produces a broader spectrum response for the device.

It is also reported that the Group V element antimony (Sb) is an effective co-dopant for increasing the solid solubility of Tl, and that the Group V element bismuth (Bi) is an effective co-dopant for increasing the solid solubility of In (see e.g. *Ion Implantation in Semiconductors*, Mayer, Eriksson, and Davies, 1970).

A Method of Fabricating the Detector

Figure 2A:
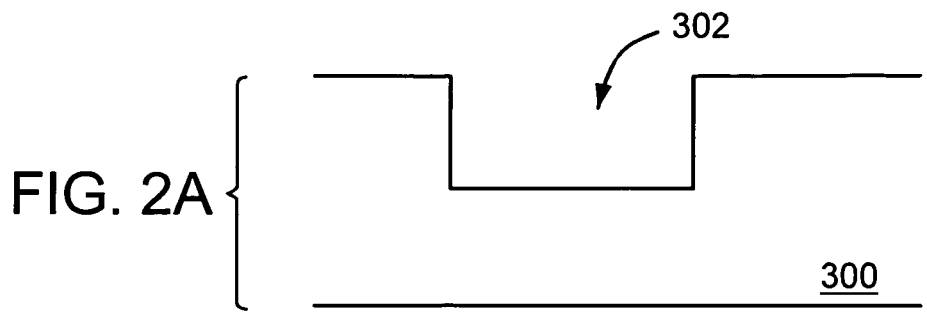
FIGS. 2A–G illustrate a method for fabricating impurity-based detectors.

An illustrative method for fabricating an impurity-based detector is depicted in the flow sequence of illustrations of FIG. 2A. In this example, the detector is fabricated in a silicon substrate 300, though it could be fabricated in any appropriately selected substrate in which waveguides can be fabricated such as for example an SOI substrate, an insulating material, or a low index material, just to name a few. The process begins with forming, e.g, by etching, a trench 302 that will define the outer perimeter of the detector (FIG. 2A). The etching of trench 302 is done using any one of a number of etching technologies that are widely used in the semiconductor fabrication industry, e.g. a plasma etch.

Figure 2B:
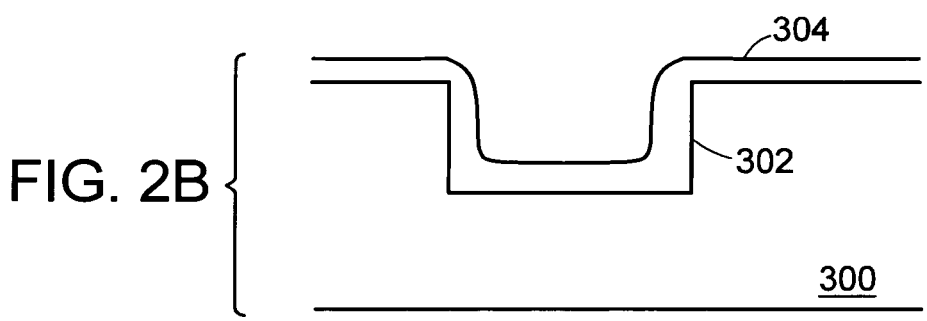

After trench 302 is made, a lower electrode layer 304 is deposited over the surface of substrate 300 and into trench 302 (FIG. 2B). This lower electrode is to be highly conducting for low electrical resistance. Electrode layer 304 can be made conducting, for example, using electrons from highly doped n-type silicon in which the dopant is phosphorous, arsenic, antimony, or bismuth. Alternatively, the electrode could be made conducting using holes with highly doped p-type silicon in which the dopant is boron, aluminum, gallium or indium. The object of this deposition is to form a conducting electrode layer that conforms to the trench but does not fill up the trench. Rather, it leaves a smaller trench of sufficiently large size to allow the several additional layers described below to be deposited.

Figure 2C:
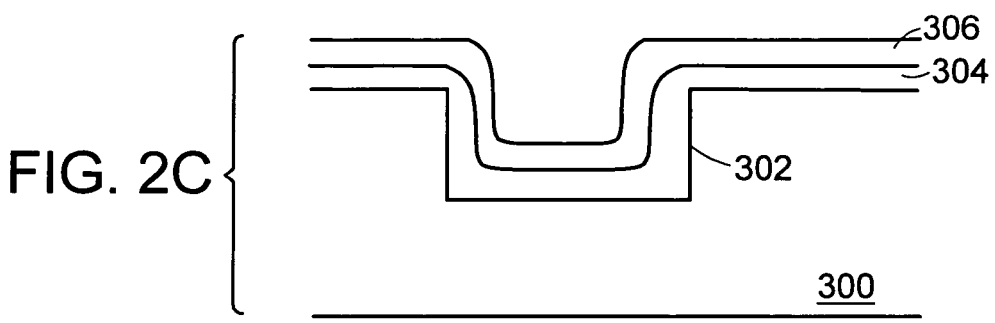

This layer should be doped at a sufficient level that the resistance of this electrode does not prevent current from the detector from efficiently flowing into the external sensing circuit. This means the series resistance of all the electrodes should be comparable or less than the resistance of the sensing circuit. On the other hand, too much doping can cause free electron scattering and absorption that reduces efficiency of the detector. Useful ranges of electrode doping are from $10^{16}$ cm$^{-3}$ to $10^{19}$ cm$^{-3}$, with the optimum depending on design requirements for loss and resistance. Furthermore, an improved design would use electrode doping that is non-uniform, with low doping in the area with high optical power, and high levels of electrode doping for low resistance in areas of that see low or no optical power. In contrast, the useful absorption caused by the impurity dopant is best placed in regions of high optical power. Increased thickness of this dopant increases absorption as long as it is illuminated by the light to be detected, but thicker regions of dopant could decrease the speed of the detector. For example, to construct a detector with response faster than 20 picoseconds, the dopant should be placed in a region approximately less than 300 nm thick After lower electrode layer 304 is in deposited, a first intermediate layer 306 of SiGe alloy is deposited on top of it (FIG. 2C). First intermediate layer 306 is the host material that will receive one or more co-dopants in a subsequent step and it represents one half of the middle portion of the detector structure. The index of refraction of this material needs to be higher than that of the silicon electrode so that it functions as a waveguide structure that contains the light. Thus, the percentage of Ge needs to be appropriately chosen, e.g. at least as large as about 2%.

Figure 2D:
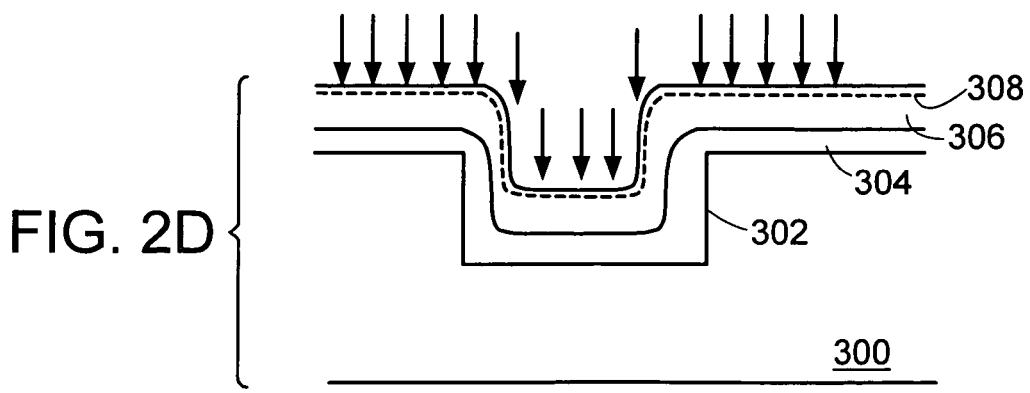

A deep level energy state inducing dopant 308, such as indium or thallium, is then implanted into first intermediate layer 306 to a sufficient depth that it will not evaporate out of the intermediate layer during subsequent processing (FIG. 2D). One or more co-dopants are also implanted into first intermediate layer 306. This can be done before, during, or after the implanting of the deep level acceptor dopant. If the co-dopant material serves multiple functions, then it may be acceptable to use only a single co-dopant. If the co-dopant material serves only one function (e.g. increasing the solubility of the deep level acceptor in the silicon lattice), then it will be appropriate to use multiple co-dopant materials. In other words, the types and number of co-dopants one selects during this phase depends on the results one wants to achieve.

Figure 2E:
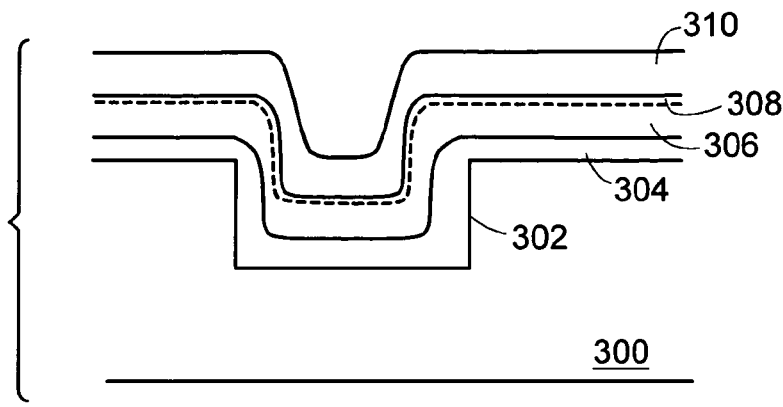
Figure 2F:
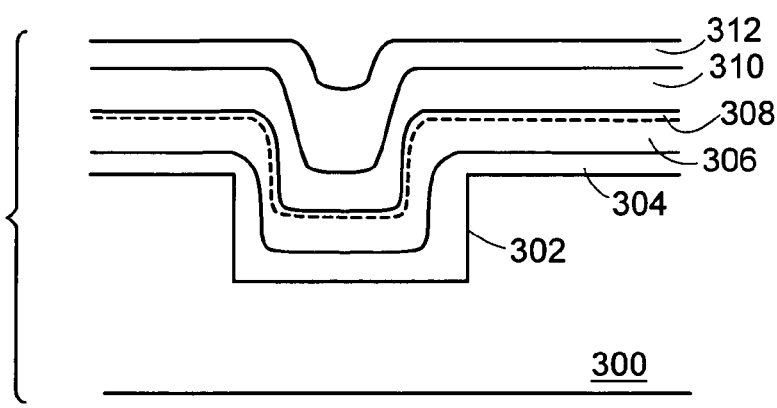

After appropriate dopant materials 308 are co-implanted into first intermediate layer 306, a second intermediate layer 310 of silicon or SiGe alloys is deposited onto first intermediate layer 306 (FIG. 2E). Again the amount of deposition is selected to not fill the trench that remained after the last deposition. This is to leave room for the final deposition of the electrode.

Finally, an upper electrode layer 312 is deposited onto second intermediate layer 310 Like lower electrode 304, upper electrode 312 can be highly doped n-type silicon in which the dopant is phosphorous or arsenic, antimony, or bismuth. Alternatively, the electrode could be made conducting using holes with highly doped p-type silicon in which the dopant is boron, aluminum, gallium or indium.

After upper electrode 312 has been deposited, the structure is thermally treated (e.g. annealed) at a sufficiently high temperature and for a sufficiently long time to cause the co-implants to diffuse out into the first and second intermediate layers 306 and 310. A conventional anneal is typically performed at 1050° C. The anneal time and temperature required is determined by the diffusion coefficient of the dopant and the thickness of the first and second intermediate layers. This anneal can occur at any appropriate time after the upper electrode has been deposited, and it need not necessarily immediately follow the formation of the upper electrode.

Figure 2G:
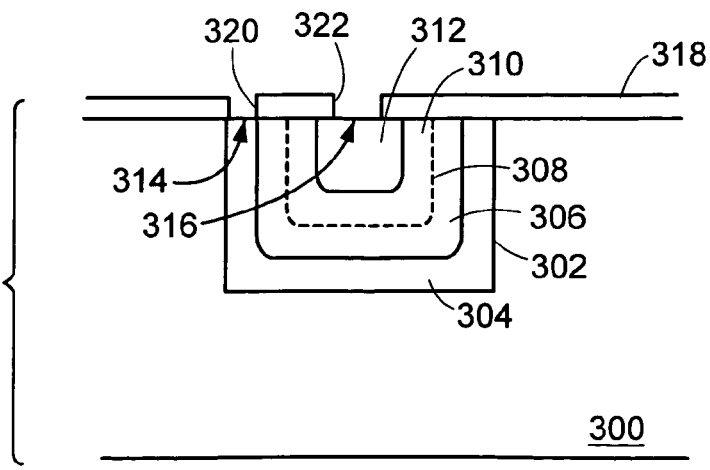

Finally, if the impurity based detector is part of a waveguide structure that is also fabricated into the silicon substrate and/or it is to be part of an optical ready substrate to which connections are made from one side, then the structure is planarized (FIG. 2G). The planarizing process, which may be performed using chemical mechanical polishing (CMP), is meant to remove the deposited layers that are above the surface of silicon substrate 300. This will expose contact points 314 and 316 to lower and upper electrode layers 304 and 312, respectively.

As noted previously, the impurity-based detector can be formed within and as part of the waveguide during the process of also fabricating the waveguide. For example, if a silicon substrate is used, the trench defines the location in which the waveguide is to be formed. The SiGe that is deposited into this trench functions principally as a waveguide except in regions or locations along that trench at which the detectors are formed. In that case, the dopants introduced in layer 308 are selectively implanted only in regions in which a detector is desired by use of standard photolithographic patterning. This patterned selection of regions of a waveguide is especially useful in optical circuits in which most of the waveguide is used for transmission of light, and the selected regions are of the waveguide are used for absorption of light by selectively implanting layer 308 into those regions. The electrode dopants can also be implanted only in the detector regions so as to reduce non-productive optical losses from free electron scattering and absorption in the transmission region of the waveguide.

The introduction of the absorbing impurity or the conducting electrode dopants could be performed by implanting at high energy after layer growth as previously described, or alternatively by incorporation by use of additional gases or fluxes of these elements during the Si or SiGe alloy epitaxial layer growth. In the latter case, the selective pattern of the dopant could be performed by selective epitaxial growth. This requires patterning of a masking material such as silicon oxide or silicon nitride in areas where the silicon or doped silicon is not desired to grow. Then, the substrate temperature and growth rate is adjusted so that epitaxial growth only occurs on the exposed SiGe alloy surfaces and not on the masking material.

The above-described waveguide illustrates an example of using a trench to form the waveguide and the included impurity-based detectors. One could also use a ridge structure instead of a trench to fabricate the waveguide and the detectors. For example, an analogous functioning waveguide detector is realized by forming on the substrate a ridge of silicon that traces out the path of the optical waveguide. Then, the three layers, which in the impurity-based detector represent the two electrodes and the intermediate impurity-doped region, are deposited over the substrate so that they cover and conform to the ridge of silicon. After etching away the appropriate material, the three layers form the optical waveguide and, in areas in which the doping is modified appropriately as discussed above, they form the impurity-based detectors within the waveguide. In yet another physical embodiment, the layers can be grown on a planar surface and then the material on either side of a strip that is to be the waveguide is etched away. The material between the two strips that have been etched away represents the waveguide and wherever it is desired to have detectors located, the doping of the layers making up the waveguide can be modified accordingly during fabrication to produce impurity-based detectors at those locations. A fill material can also be deposited to fill up the portions that were etched away on either side of the waveguide to thereby define the side walls of the waveguide and the impurity-based detectors. The nature of the material that is used to fill those portions will depend on whether the material is designed to aid in confinement of the optical signal or in electrically connecting to the detectors. For example, if it is meant to aid in confinement of the optical signal in the lateral direction, the fill material should have on average a lower refractive index than the material making up the detector and waveguide.

Of course, if the detector is to be used as a standalone device or in some other environment, it might not be necessary to planarize the structure to expose the contact point for the lower electrode, as described above. Rather, one could make one contact to the top electrode from above and the other to the lower electrode from below through the backside of the structure. Yet another alternative is to form an insulated contact hole from the top to contact the bottom electrode.

In any case, in one embodiment, the final steps involve depositing an insulating layer 318 over the structure, forming contact vias 320 and 322 through insulating layer 318 and to the contact points 314 and 316 on the lower and upper electrodes, respectively; depositing a metal, e.g. aluminum, within the vias to form ohmic contacts at the bottom of the vias; and then filling vias 320 and 322 with metal (e.g. tungsten plugs) that provides electrical connectivity to the ohmic contacts at the bottom of the vias. Of course, there are likely to be many other layers deposited on top of the structure depending on the circuit in which this device is embedded. So, the process of forming the contact vias might occur much later in a more involved fabrication process. In addition, if the device is part of an optical ready wafer, the eventual connection to the lower and upper electrodes might be performed by another entity, such as the company that fabricates the semiconductor microelectronic circuits above the optical layer.

Figure 3:
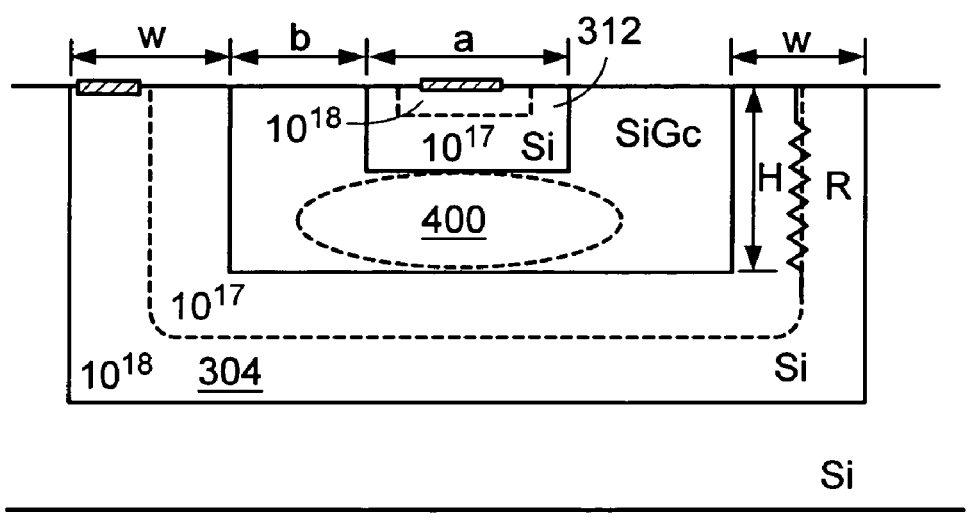
FIG. 3 depicts in schematic form an impurity-based SiGe alloy detector.

Referring to FIG. 3, there are a number of considerations worth keeping in mind when fabricating the impurity-based detector just described. For one thing, if the detector is coupled to a waveguide, the optical energy from the waveguide will need to propagate into the detecting region 400. It is thus important to carefully match the mode of the waveguide to the mode of the detector so that this coupling of energy is optimized.

In the case of a SiGe alloy waveguide that is designed to carry 1300 nm optical signals, we have found that a core that is about 1 μm deep and 3 μm wide works well. For a waveguide of that design, a good geometry for the detector is as shown in FIG. 2 with the dimensions as follows: the width "a" of the upper electrode equals about 1.0 μm; the depth of the upper electrode equals about 0.25 μm, the width "b" of the detecting region equals about 0.75 μm; the depth "H" of the detecting region equals about 1.0 μm; and the width "W" of the lower electrode equals about 1.0 μm. For high-speed performance it is preferred to keep the series resistance of the detector as low as possible. For high speed operation with probing through a 50 Ohm impedance transmission line, it is desirable to keep the resistance R of the upper extension of the lower electrode to the contact point on the surface to less than about 10 Ω. For high-speed operation with a high resistance local sensor such as a transistor, the useful resistance could be larger, as high as 1000 to 3000 ohm over length of detector in micrometers. The limit of the resistance is the product of the device capacitance, about 2 femtoFarads per micrometer for a PN diode in the geometry described above and the series resistance, giving an electrical charging time response of 2 to 6 picoseconds for the high resistance described above. A smaller series resistance is accomplished by making the width "W" larger and making the height "H" shorter. Also, additional higher doping outside the region seen by the light could lower the series resistance without increasing optical absorption from the free carriers.

Another consideration is to keep the light of the optical signal away from the electrons in the highly-doped electrode regions 304 and 312. This can be accomplished in both lower electrode 304 and upper electrode 312 by grading the doping away from the light of the mode propagating through the detector. One way to do this in lower electrode 304 is to change the doping of the layer as it is being deposited. For example, the first half of the deposition puts down a layer of doped silicon in which $N_D=10^{18}$ cm$^{-3}$ and the second half of the deposition puts down a layer with $N_D=10^{17}$ cm$^{-3}$. Thus, the region of electrode 304 that is closest to the light that is propagating through the center of the detector (i.e., absorbing region 400 in FIG. 2) has lower doping levels and is thus less likely to provide electrons that absorb light through scattering. A similar approach can be used to deposit upper electrode 312, putting the more highly doped part of upper electrode 312 near the surface where the contact will be formed.

The doping profiles can be more complex than a simple binary function. They can, for example, be graded from one side of the electrode to the other in a more continuous manner. The profiles that are generated are simply a matter of how the dopants are supplied to the system as the layer is being deposited. The final doping profile will further depend on movement or diffusion of the dopants during any anneal cycles, which must be considered in any design optimization.

In general during this phase of the fabrication process (i.e., forming the intermediate layer that is implanted with a deep level energy state), the goal is to choose the ion implanting energies, the doses, the times and the temperatures so that the detector region is heavily doped with deep level energy states, especially within the light/solid interaction region and preferably where the light intensity is strongest. A typical energy for implanting the thallium or the indium into the first intermediate layer is between 100 kV and 200 kV, which is the range of energies in which many commercially available implantation systems operate. In general, the ion energy needs to be sufficient to achieve an adequate projected range into the host SiGe alloy (e.g. at least about 0.1 μm) so the dopant remains in the host material during subsequent processing. Because economically useful implant energies may only allow shallow implants, smaller than the micrometer thickness of the SiGe alloy waveguide, it may be necessary to interrupt the growth of the waveguide so as to create the implant at a point where the light intensity is highest within the guide.

As an alternative to implanting, the impurity could be incorporated as part of the SiGe growth process by CVD or MBE, but only allowed to incorporate during the part of the growth where the impurity is desired to be placed. This in-situ impurity growth technique is well known for creating doping profiles of P and N regions in different layers using very similar species of boron, arsenic, and phosphorous.

In reality, the implant energies can be as low as a few hundred KeV or as high as a few MeV. If low implant energies are used, then other known techniques will likely have to be employed to prevent that shallow implanted material from escaping during subsequent processing before it is able to diffuse into the host material. A commonly used well-known technique to address this problem is to use a capping layer (e.g. $SiO_2$ or $Si_3N_4$) to hold the implant in place until the diffusion into the host material has taken place.

The target doses for the indium or thallium during implantation are generally between about $10^{12}$-$5\times10^{15}$ $cm^{-2}$ and more particularly between about $10^{13}$-$10^{14}$ $cm^{-2}$ to the depth of about 0.1 µm. When this implanted dopant is later diffused down into the two intermediate layers, that will produce a doping level in the range of $10^{17}$-$10^{18}$ $cm^{-3}$, depending of course on whether a co-dopant is also used to reach the higher concentration. As noted above, more doping increases absorption and thus the efficiency of the detector but it also increases the dark current in the photoconductive detector. So the optimum level will depend on the design goals for the system in which the detector will be implemented and will be a trade-off between these two considerations.

Fabricating an Electronic Circuitry on an Optical Ready Substrate

As noted above, the impurity-based detector can be formed in an optical ready-substrate onto which semiconductor electronic circuitry will later be fabricated. The sequence of process steps for fabricating the electronic circuit above the optical-ready substrate is generally illustrated in FIGS. 4A–J.

Figure 4A:
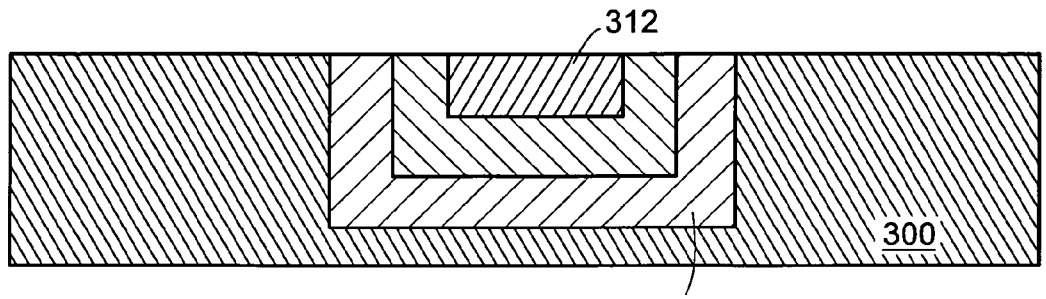
FIGS. 4A–J illustrate a method for fabricating a semiconductor circuit on an optical ready substrate.

After the structure shown in FIG. 1F is planarized using for example CMP, the resulting structure is as shown in FIG. 4A. It is assumed that the substrate also includes other optical components that are not shown, such as laser elements for generating the optical signals from electrical signals, optical waveguides for distributing the optical signals, and mirrors or other reflecting elements for directing optical signals up to circuitry that is fabricated above the waveguides or for receiving optical signals from above and directing those signals into the waveguides.

Figure 4B:
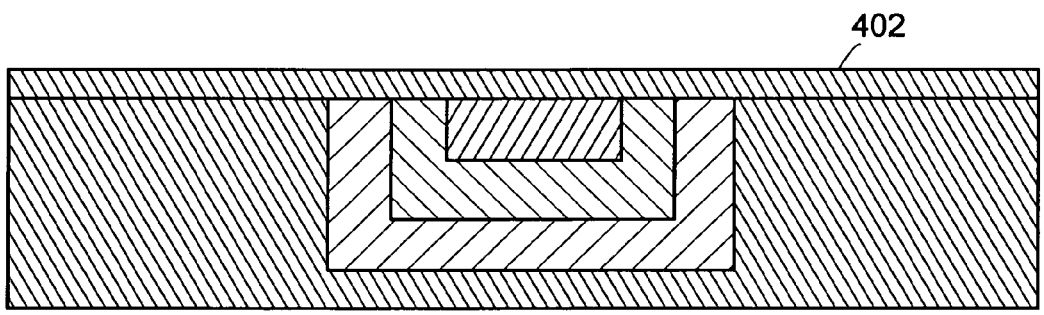
Figure 4C:
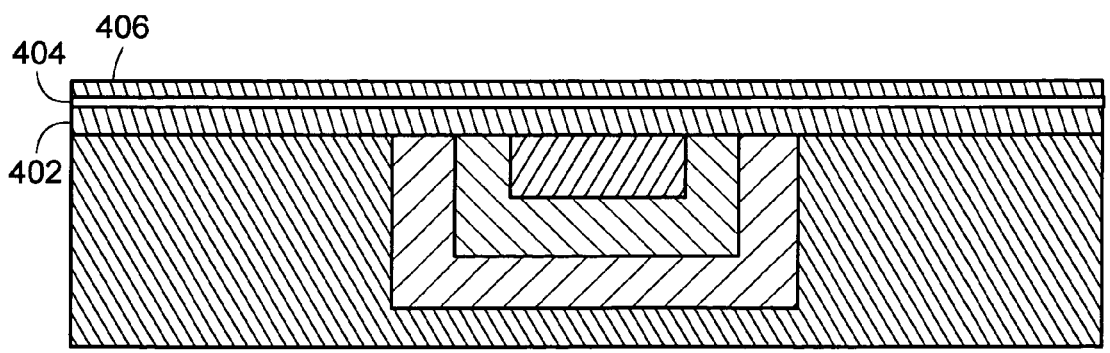

On top of the planarized surface that was formed above the optical circuitry, a layer of silicon 402 is deposited (see FIG. 4B). This may be accomplished in a number of alternative ways including for example, through a chemical vapor deposition process. The resulting layer provides a surface onto which a silicon wafer can then be bonded by using well-known processes to form an SOI (silicon-on-insulator) structure. The SOI structure includes an insulating layer 404 (e.g. $SiO_2$) and above that a silicon layer 406, which provides a substrate into which the electronic circuitry is to be fabricated (see FIG. 4C).

Figure 4D:
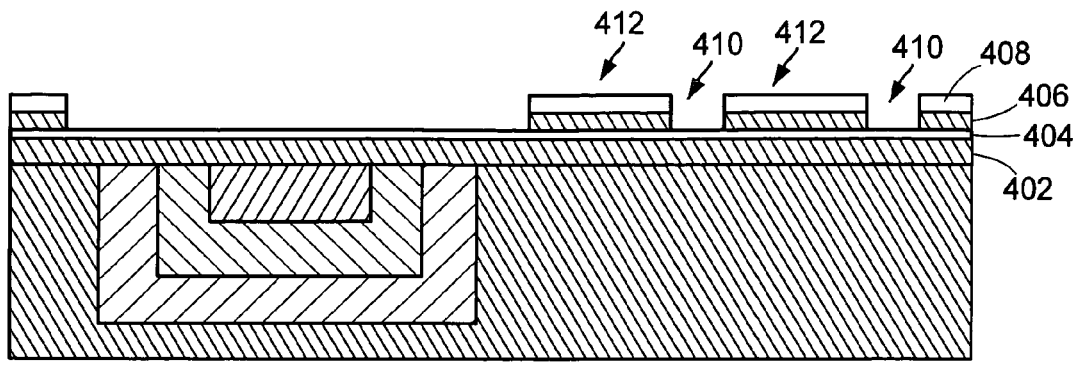
Figure 4E:
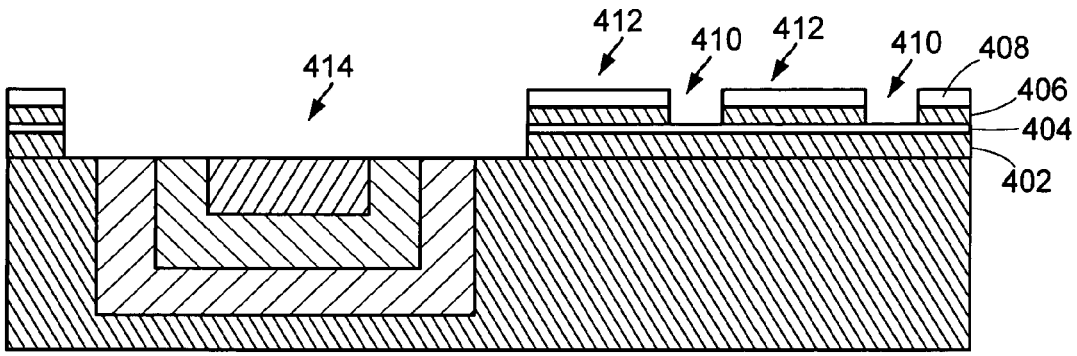
Figure 4F:
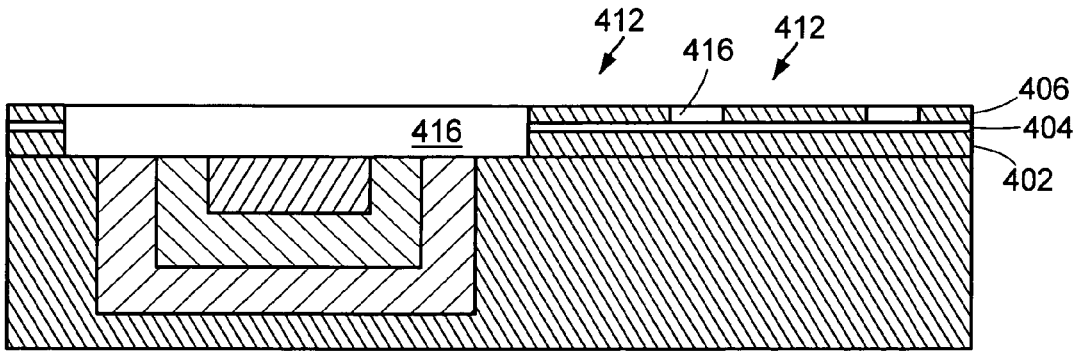
Figure 4G:
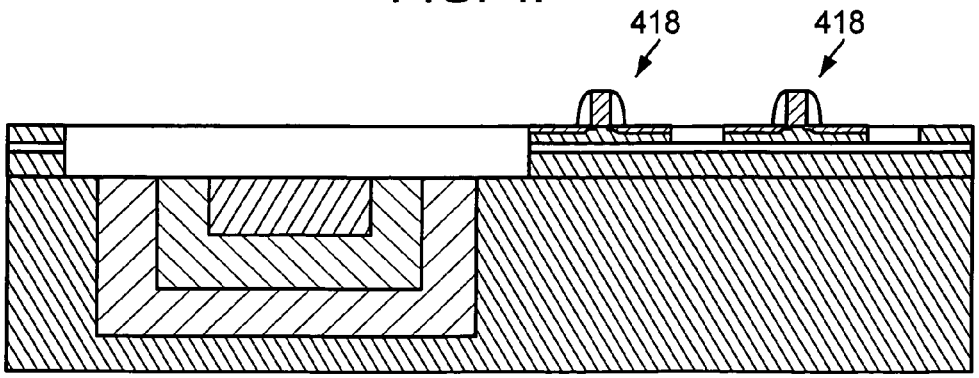
Figure 4H:
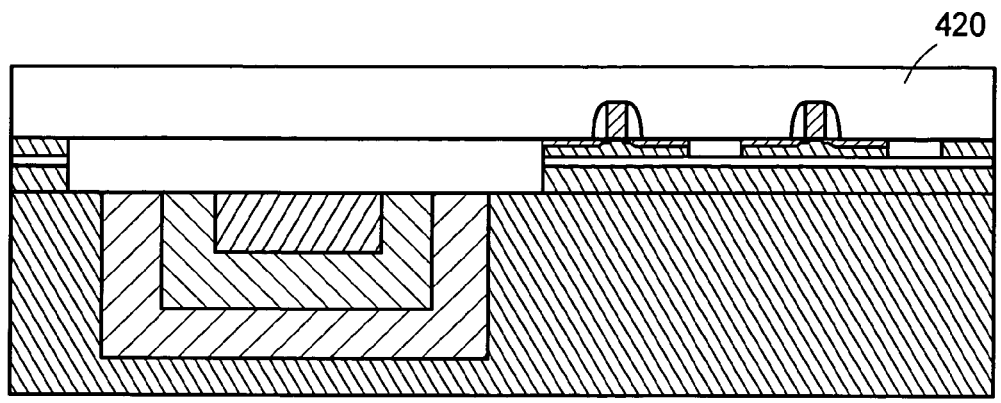
Figure 4I:
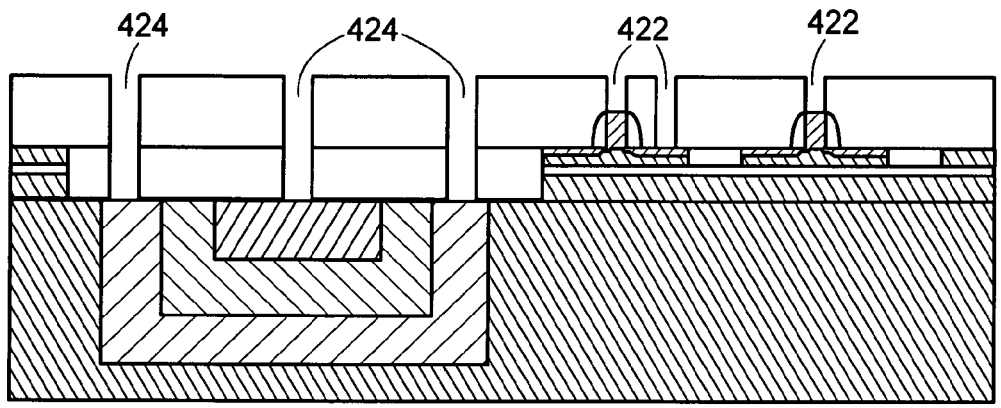
Figure 4J:
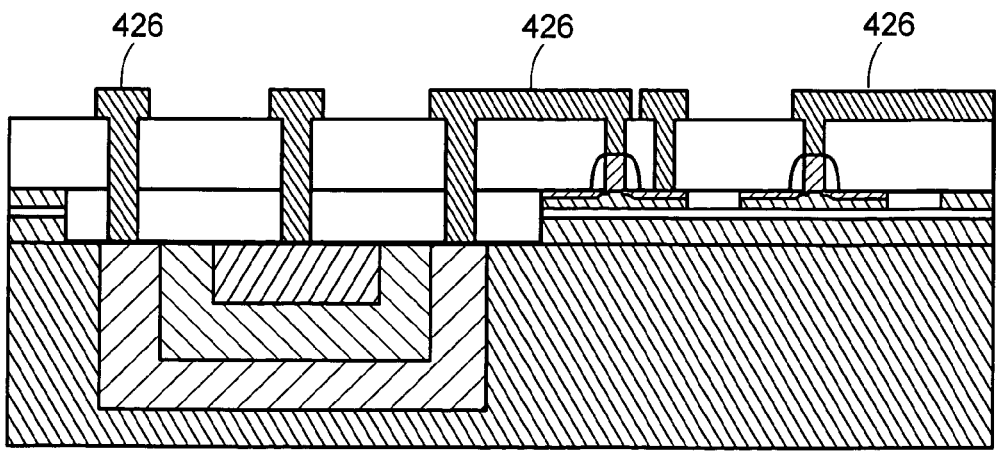

Next, a hard protective layer 408 (e.g. silicon nitride) is deposited over the surface and patterned to create isolation openings 410 that form electrically-isolated islands of silicon 412 (see FIG. 4D). After using an appropriate mask, deeper isolation openings 414 are then etched through both insulating layer 404 and silicon layer 402 to expose the underlying impurity-based detectors (see FIG. 4E).

To produce a smooth, flat surface for fabricating the electronic circuitry into the islands of silicon an oxide layer 416 (e.g. $SiO_2$) is deposited over the surface of the wafer. Then, CMP is used to planarize that deposited oxide layer and remove protective layer 408 in the process, thereby exposing the upper surfaces of the silicon islands 412 (see FIG. 4F).

The rest of the process generally involves standard semiconductor circuit fabrication steps except when it comes to electrically connecting with the underlying impurity-based detectors. In other words, transistors 418 and other electrical components (not shown) are then formed in the islands of silicon using known fabrication techniques, e.g. CMOS fabrication techniques (see FIG. 4G). After that, a thick oxide 420 is deposited over the entire wafer and planarized (see FIG. 4H). Following that, contact openings 422 are etched in the oxide down to the components. The etch that is done during this phase is modified in comparison to conventional etch schedules so that in selected areas the openings 424 reach deeper down to the detectors located at a level below the electrical components (see FIG. 4I). After the contact opening are formed, metal 426 is deposited and patterned to form the required interconnects (see FIG. 4J). Though the metallization is illustrated as all residing in a single layer, for the more complex circuits for which one would likely use the optical ready substrate, the metalizations occupy multiple layers each separated by insulating material, e.g. $SiO_2$.

Note that the above description of a process for fabricating the electronic circuitry above the optical ready substrate omitted many minor steps that are well known to persons of ordinary skill in the art. This discussion was meant to be merely a high level description of an example of a sequence of fabrication steps that would produce the desired structure. For a more detailed discussion of all of the process steps that are involved the reader is referred to other publicly available sources in the public literature.

Use of Impurity Absorption in a Detector Device

There are many ways to use absorption in a detector. Depending on the semiconductor doping in the cladding electrode layers surrounding the impurity region relative to the charge polarity of the impurity region, a detector device could be a photoconductive detector, a PIN diode detector, or a phototransistor.

A Photoconductive Detector

If the cladding electrode layers of the impurity region have the same majority carrier as the impurity region, then the detector is photoconductive. For example, if thallium or indium is used as an impurity, they tend to create a P-type semiconductor with excess holes. If both top and bottom cladding electrode layers are also doped with P-type acceptors such as boron that creates holes, then the device is a photoconductor. A photoconductor has the property of changing electrical resistance when carriers are generated by light absorption. If more or less carriers are created by transitions to or from an impurity, then the resistance will change. For low dark current, the middle impurity region can be co-doped to reduce net free charge. For instance, the thallium or indium doping could be co-doped with arsenic that creates electrons. If the arsenic co-doping is properly balanced so an electron is made to fill each hole, but not too much to have extra electrons, then the impurity region could be made to have low excess charge from electrons or holes. This would then increase the resistance and lower the current through the unlit, or dark, photoconductor.

A P-I-N Diode Detector

Fabricating a P-I-N diode detector can solve the problem of the relatively large dark currents that tend to characterize the photoconductive detectors. The P-I-N structure is basically the same as what was described above except that the one electrode is highly doped with a P-type acceptor such as boron and the other buffer electrode is doped with a donor such as arsenic or phosphorous. When this detector is run in reverse electrical bias, low electrical current leaks through a good quality diode, yet efficient high speed detection of light can occur.

A Phototransistor Detector

Yet another type of detector is a phototransistor. If the cladding electrode layers of the impurity region have the opposite majority carrier as the impurity region doping, then the detector is a phototransistor. For example, if thallium or indium is used as an impurity, they tend to create a P-type semiconductor with excess holes. If both top and bottom cladding electrode layers are doped with the opposite N-type acceptors such as arsenic or phosphorous that create electrons, then the device is a phototransistor. A phototransistor has the property of amplifying the charge current generated by light absorption. The amplification is the well-known transistor effect from bipolar NPN transistors, but in this case the transistor's base current is provided by the impurity absorption rather than a third connecting wire.

Though we have described photoconductor, photodiode, and phototransistor detectors, it should be understood that these are simply specific examples of what can be referred to more generally as photoconductive detectors and photodiode detectors, respectively. In other words, the electrodes are not restricted to being N-type or P-type, they could also be metal electrodes. In addition, the absorbing region (i.e., the I-region) may be an insulator, a weakly conductive region, or even a highly conductive region.

The impurity-based SiGe alloy detectors described above are considered to be particularly useful in the fabrication of the optical ready substrates such as are described in detail in U.S. patent application Ser. No. 10/280,505, filed Oct. 25, 2002, entitled "Optical Ready Substrates," and U.S. patent application Ser. No. 10/280,492, filed Oct. 25, 2002, entitled "Optical Ready Wafers," both of which are incorporated herein by reference. Some of the waveguides that are mentioned in connection with the optical ready substrates are SiGe alloy waveguides. Methods of making such waveguides are described in publicly available scientific literature including, for example, U.S. patent application Ser. No. 09/866,172, filed May 24, 2001, entitled "Method for Fabricating Waveguides," and to U.S. patent application Ser. No. 10/014,466, filed Dec. 11, 2001, entitled "Waveguides Such As SiGeC alloy Waveguides and Method of Fabricating Same," both of which are incorporated herein by reference.

The impurity-based detector can be fabricated either after the SiGe alloy waveguide has been fabricated or before. Also, it can be part of the optical waveguide or as a termination of an optical waveguide.

In addition, multiple different circuit components that employ optical conversion, e.g. diodes, free space detectors, modulators, transistors, and more complex circuit elements, can benefit from the principles described herein. That is, the invention is not limited to just optical detectors fabricated in or next to optical waveguides.

OTHER EMBODIMENTS

The embodiments described above use SiGe alloys as the semiconductor. Other alternative semiconductors can be used including, but not limited to, Si, Ge, and SiGeC Group IV alloys and Group III-V alloys such as GaAs, InP, and combinations thereof such as InGaAsP. The availability of the other materials extends the range of wavelengths for which this detector can be used from about 650 nm to at least about 1500 nm. More specifically, the above-described concepts can be used to fabricate detectors that work for wavelengths well beyond 1500 nm. For example, one could use such concepts to fabricate detectors that operate in the wavelength region of 10 μm and beyond, i.e., the far infra-red.

It should also be understood that methods other than the one described above could be used to fabricate the intermediate detector region. The above-described method involved growing half of the layer, implanting the deep level acceptor material, and then growing the other half of the layer. Alternatively, one could epitaxially grow the entire intermediate layer and then use a higher energy to implant the deep level material farther into that layer. Or, one could employ in-situ doping of the intermediate layer as it is being deposited by epitaxial methods or by physical vapor deposition (PVD) or by chemical vapor deposition (CVD) or by other known deposition methods.

The deep level implants are also not limited to indium and thallium as dopants. They include any material, e.g. element, isotope, molecule or chemical complex, which produces a deep level energy state. In general, deep level energy states are those energy states that are at least about 100 meV from the conduction or the valence band; whereas, shallow level dopants are those that produce energy states that might be less than about 20–40 meV from the band edge. Other elements or isotopes that produce such deep level acceptor states might include zinc, iron, tin, and sulphur, just to name a few. Of course, the range of choices that can be used to fabricate these devices might be severely limited by other requirements that are placed on the device. For example, if the device is expected to survive subsequent thermal cycling to high temperatures, e.g. 1000° C., then the choices are fewer because that will likely exclude materials having high diffusion rates and materials whose thermal stability is not sufficient.

Indeed, the deep level energy states could be produced in ways other than through introducing dopants into the material. For example, one could produce such states by creating crystallographic defects in the material, by creating a periodic multilayer structure, or by creating microstructures in the material. It should be understood that any mechanism that produces the deep level energy states in the energy band would be acceptable.

In addition, two or more co-implants or co-dopants can be used with the deep level dopant to accomplish one or more of the previously described beneficial objectives. For example, both carbon and arsenic can be used in connection with indium. Or arsenic and phosphorous can be used along with a deep level acceptor dopant. Or more than two co-dopants can be used depending on what the desired objectives are. Indeed, as experience in other devices shows, it is often advantageous to introduce multiple co-dopants to optimize performance.

In the described embodiment of the impurity-based detector, we focused on one particular transition, namely, the transition of an electron from the filled deep level acceptor state to the conduction band. There are, however, at least two other transitions that are of potential interest. The first one is a transition of an electron from deep in the valence band to the neutral acceptor. The second one is a transition of an electron from the valence band to an ionized donor site. Any of these transitions create excess carriers that will contribute to an electrical signal. It might be desirable to emphasize one or another of these transitions by manipulating the ionization level of the deep acceptor states.

One way of manipulating this ionization level is with co-dopants, as described above. Without co-doping, roughly half of the indium acceptors will be neutral, and more than 90% of the thallium acceptors will be neutral. Another way of manipulating the ionization level of the acceptors would be using a P-N junction (in the photodiode detector). In this case, virtually all of the acceptors in the P-N junction depletion region would be ionized, facilitating the acceptor-conduction band transitions.

An improvement is to place the impurity-based detector in an optical resonator for the wavelength to be detected, which allows more absorption and photocurrent at a given or lower optical power. For example, a cavity can be created by using two mirrors spaced on opposite sides of the absorber with a separation that causes the light to resonate through constructive interference. These mirrors can be created by a thin metal, a dielectric stack, or a periodic pattern along the waveguide as in a Bragg grating. The Bragg grating has a special advantage in that it can be made very narrow band in wavelength, even narrower than the resonator bandwidth. So, if light is not amplified it will not be reflected either.

Other resonators for the detector can be made with waveguide rings in close coupling to the serial waveguide, which would also only detect light at the resonant wavelength and transmit light at other wavelengths. The limitation of a resonator is that it must be sufficiently stable over all temperatures and not reflect sufficient light back down the waveguide that could cause interference with the optical source. Both of the above-mentioned resonators could accomplish this task with good engineering.

Finally, we note that the structure shown in FIG. 3 is connected as a two-terminal detector. However, the ideas described herein can be embodied in devices with three or more terminals. For example, if used in a three terminal bipolar transistor, the impurity-doped region might be the base region of the device.

Still other embodiments are within the following claims.

What is claimed is:

1. An optical circuit comprising:
   a semiconductor substrate comprising silicon;
   an optical waveguide formed in or on the substrate, said optical waveguide comprising a core made of a SiGe alloy; and
   an optical detector formed in or on the semiconductor substrate, said optical detector aligned with the optical waveguide so as to receive an optical signal from the optical waveguide during operation, said optical detector having:
   a first electrode;
   a second electrode, wherein the first electrode comprises a first doped semiconductor material and the second electrode comprises a second doped semiconductor material and wherein the first and second doped semiconductor materials are of the same conductivity type; and
   an intermediate layer between the first and second electrodes, said intermediate layer comprising a semiconductor material characterized by a conduction band, a valence band that is at a lower energy level than the conduction band, and deep level energy states introduced between the conduction and valence bands.

2. The optical circuit of claim 1, wherein the optical detector is formed in the waveguide.

3. The optical circuit of claim 2, wherein the waveguide is formed in a trench in the substrate.

4. The optical circuit of claim 3, wherein the optical detector is also formed in said trench.

5. The optical circuit of claim 1, wherein the first semiconductor material comprises a first doped silicon and the second semiconductor material comprises a second doped silicon.

6. The optical circuit of claim 5, wherein the first and second doped semiconductor materials are N-type.

7. The optical circuit of claim 5, wherein the first and second doped semiconductor materials are P-type.

8. The optical circuit of claim 5, wherein the doping of the first and second semiconductor materials increases as a function of distance from the intermediate layer.

9. An optical circuit comprising:
   a semiconductor substrate;
   an optical waveguide formed in or on the substrate; and
   an optical detector formed in or on the semiconductor substrate, said optical detector aligned with the optical waveguide so as to receive an optical sianal from the optical waveguide during operation, said optical detector having:
   a first electrode;
   a second electrode; and
   an intermediate layer between the first and second electrodes, said intermediate layer comprising a semiconductor material characterized by a conduction band, a valence band that is at a lower energy level than the conduction band, and deep level energy states introduced between the conduction and valence bands, wherein the semiconductor material is a SiGe alloy that is doped with at least one of indium and thallium to produce the deep level energy states.

10. The optical circuit of claim 9, wherein the semiconductor material is $Si_{0.95}Ge_{0.05}$.

11. The optical circuit of claim 9, wherein said semiconductor material also includes a co-dopant that functions to either substantially fill or substantially deplete said deep level energy states or improve optical activation of the deep level energy states.

12. The optical circuit of claim 11, wherein the co-dopant is carbon.

13. The optical circuit of claim 11, wherein the co-dopant is selected from the group consisting of arsenic, phosphorous, and carbon.

14. The optical circuit of claim 1, wherein the semiconductor material is a SiGe alloy.

15. The optical circuit of claim 14, wherein the semiconductor material is $Si_{0.95}Ge_{0.05}$.

16. The optical circuit of claim 14, wherein the semiconductor material is doped with at least one of indium and thallium to produce the deep level energy states.

17. The optical circuit of claim 14, wherein said semiconductor material also includes a co-dopant that functions to either substantially fill or substantially deplete said deep level energy states or improve optical activation of the deep level energy states.

18. The optical circuit of claim 17, wherein the co-dopant is carbon.

19. The optical circuit of claim 17, wherein the co-dopant is selected from the group consisting of arsenic, phosphorous, and carbon.

20. The optical circuit of claim 9, wherein the optical detector is formed in the waveguide.

21. The optical circuit of claim 20, wherein the waveguide is formed in a trench in the substrate.

22. The optical circuit of claim 21, wherein the optical detector is also formed in said trench.

23. The optical circuit of claim 9, wherein the substrate comprises silicon.

24. The optical circuit of claim 23, wherein the optical waveguide comprises a core made of a SiGe alloy.

25. The optical circuit of claim 24, wherein the first electrode comprises a first doped semiconductor material and the second electrode comprises a second doped semiconductor material.

26. The optical circuit of claim 25, wherein the first doped semiconductor material comprises a first doped silicon and the second doped semiconductor material comprises a second doped silicon.

27. The optical circuit of claim 26, wherein the first doped silicon and the second doped silicon are of opposite conductivity types.

28. The optical circuit of claim 26, wherein the first doped silicon and the second doped silicon are of the same conductivity type.

29. The optical circuit of claim 25, wherein the first and second doped semiconductor materials are N-type.

30. The optical circuit of claim 25, wherein the first and second doped semiconductor materials are P-type.

31. The optical circuit of claim 26, wherein the doping of the first and second semiconductor materials increases as a function of distance from the intermediate layer.

* * * * *